US012625173B2

(12) United States Patent
Bluestone et al.

(10) Patent No.: US 12,625,173 B2
(45) Date of Patent: May 12, 2026

(54) METHODS AND APPARATUS FOR IN-SITU MEASUREMENT OF MUTUAL INDUCTANCE BETWEEN EMBEDDED INTERCONNECTS

(71) Applicant: The Boeing Company, Arlington, VA (US)

(72) Inventors: Aaron James Bluestone, Camarillo, CA (US); Erik Stephen Daniel, Simi Valley, CA (US); Khashayar Pirouzmand, Sherman Oaks, CA (US)

(73) Assignee: THE BOEING COMPANY, Arlington, VA (US)

( * ) Notice: Subject to any disclaimer, the term of this patent is extended or adjusted under 35 U.S.C. 154(b) by 252 days.

(21) Appl. No.: 18/498,899

(22) Filed: Oct. 31, 2023

(65) Prior Publication Data

US 2025/0138071 A1 May 1, 2025

(51) Int. Cl.
| | |
|---|---|
| *G01R 27/26* | (2006.01) |
| *G01R 19/00* | (2006.01) |
| *H04B 3/487* | (2015.01) |

(52) U.S. Cl.
CPC ...... *G01R 27/2611* (2013.01); *G01R 19/0038* (2013.01); *H04B 3/487* (2015.01)

(58) Field of Classification Search
CPC ............ G01R 27/2611; G01R 19/0038; G01R 31/58; G01R 27/32; H04B 3/487; H04B 3/46
See application file for complete search history.

(56) References Cited

U.S. PATENT DOCUMENTS

| | | | |
|---|---|---|---|
| 3,665,458 | A | 5/1972 | Mulkey et al. |
| 5,339,041 | A | 8/1994 | Nitardy |
| 5,404,113 | A | 4/1995 | Nitardy |
| 6,411,108 | B1 | 6/2002 | Douglas et al. |
| 6,611,148 | B2 | 8/2003 | Clinton |
| 6,700,399 | B1 | 3/2004 | Savithri |
| 7,067,842 | B1 | 6/2006 | Jayapalan et al. |
| 7,337,419 | B2 | 2/2008 | Hossain |
| 7,349,471 | B2 | 3/2008 | Cosand et al. |
| 7,639,001 | B2 | 12/2009 | Harres |

(Continued)

OTHER PUBLICATIONS

Extended European Search Report for European Application No. 24196283.6 dated Feb. 17, 2025, 8 pages.

(Continued)

*Primary Examiner* — Feba Pothen
(74) *Attorney, Agent, or Firm* — MH2 Technology Law Group LLP

(57) ABSTRACT

A system and method for measuring mutual inductance between adjacent first communication transmission line and second communication transmission line is disclosed. The system includes a mutual inductance measurement circuit that includes a coupling generator which biases the first communication transmission line with a current ramp signal; a sample and hold circuit which captures an induced voltage on the second communication transmission line using a switched capacitor storage element; a switched capacitor integrator configured to integrate the induced voltage onto an output voltage node; and a comparator configured to switch states once the switched capacitor integration has surpassed a reference trippoint.

20 Claims, 13 Drawing Sheets

(56) References Cited

U.S. PATENT DOCUMENTS

| | | | |
|---|---|---|---|
| 8,214,781 B1 | 7/2012 | Liu et al. | |
| 8,253,392 B2 | 8/2012 | Thiesen et al. | |
| 8,638,105 B2 | 1/2014 | Martinelli | |
| 9,300,356 B2 | 3/2016 | Winward et al. | |
| 9,503,155 B2 | 11/2016 | Gabriel | |
| 9,871,293 B2 | 1/2018 | Patel et al. | |
| 10,063,077 B2 | 8/2018 | Solodovnik et al. | |
| 10,771,108 B1 | 9/2020 | Fazeel et al. | |
| 10,892,911 B2 | 1/2021 | Wojciechowski | |
| 11,029,355 B2 | 6/2021 | Yao et al. | |
| 11,223,368 B1 * | 1/2022 | Prakash | H03M 1/0673 |
| 11,233,557 B2 | 1/2022 | Lee et al. | |
| 11,608,186 B2 | 3/2023 | Solodovnik et al. | |
| 12,068,802 B1 | 8/2024 | Bluestone et al. | |
| 2001/0033177 A1 | 10/2001 | Lindolf et al. | |
| 2002/0039028 A1 | 4/2002 | Douglas et al. | |
| 2003/0020484 A1 | 1/2003 | Clinton | |
| 2004/0019864 A1 | 1/2004 | Kim et al. | |
| 2004/0207412 A1 | 10/2004 | Kunikiyo et al. | |
| 2005/0105606 A1 | 5/2005 | Cosand et al. | |
| 2007/0165680 A1 | 7/2007 | Harres | |
| 2010/0052658 A1 | 3/2010 | Harres | |
| 2011/0069782 A1 | 3/2011 | Wilson et al. | |
| 2013/0240884 A1 | 9/2013 | Barth et al. | |
| 2014/0372057 A1 | 12/2014 | Van Der Plas et al. | |
| 2015/0091603 A1 | 4/2015 | Tomita et al. | |
| 2015/0155912 A1 | 6/2015 | Winward et al. | |
| 2015/0229293 A1 | 8/2015 | Nagahisa et al. | |
| 2016/0119024 A1 * | 4/2016 | Muljono | H04B 3/32 |
| | | | 370/201 |
| 2017/0279287 A1 | 9/2017 | Solodovnik et al. | |
| 2019/0049498 A1 | 2/2019 | Mori | |
| 2019/0138782 A1 | 5/2019 | Zhang | |
| 2024/0106401 A1 | 3/2024 | Nicollini et al. | |
| 2025/0119178 A1 | 4/2025 | Bluestone et al. | |

OTHER PUBLICATIONS

Kaushik et al., "An analytical approach to dynamic crosstalk in coupled interconnects," Microelectronics Journal, vol. 41, 2010 (Available online Feb. 6, 2010), pp. 85-92.

Ogashara et al., "Measurement and Analysis of Inductive Coupling Noise in 90 nm Global Interconnects," IEEE Journal of Solid-State Circuits, vol. 43, No. 3, Mar. 2008, pp. 718-728.

Sinha et al., "Validation and Test Issues Related to Noise Induced by Parasitic Inductances of VLSI Interconnects," IEEE Transactions on Advanced Packaging, vol. 25, No. 3, Aug. 2002, pp. 329-339.

Yu et al., "Staggered Twisted-Bundle Interconnect for Crosstalk and Delay Reduction," Proceedings of the Sixth International Symposium on Quality Electronic Design (ISQED'05), Mar. 21-23, 2005, 6 pages.

Bluestone, A.J., "Parasitic Tolerant Charge-Based Coupling Measurement," U.S. Appl. No. 18/483,344, filed Oct. 9, 2023, 30 pages.

Chang Y. W. et al., "A novel CBCM method free from charge injection induced errors: investigation into the impact of floating dummy-fills on interconnect capacitance", Microelectronic Test Structures, 2005. ICMTS 2005. Proceedings of the 2005 International Conference On Leuven, Belgium Apr. 4-7, 2005, Piscataway, NJ, USA, IEEE, US, Apr. 4, 2005, pp. 235-238.

Sylvester D. et al., "Investigation of Interconnect Capacitance Characterization Using Charge-Based Capacitance Measurement (CBCM) Technique and Three-Dimensional Simulation," IEEE Journal of Solid-State Circuits, IEEE, USA, vol. 33, No. 3, Mar. 1, 1998, pp. 449-453.

Extended European Search Report issued in related European Patent Application No. 24182621.3, dated Dec. 20, 2024, 8 pages.

Vendrame et al., "Crosstalk-Based Capacitance Measurements: Theory and Applications," IEEE Transactions on Semiconductor Manufacturing, vol. 19, No. 1, Feb. 2006, pp. 67-77.

Xu et al., "On-Chip Test Circuit for Measuring Substrate and Line-to-Line Coupling Noise," IEEE Journal of Solid-State Circuits, vol. 41, No. 2, Feb. 2006, pp. 474-482.

* cited by examiner

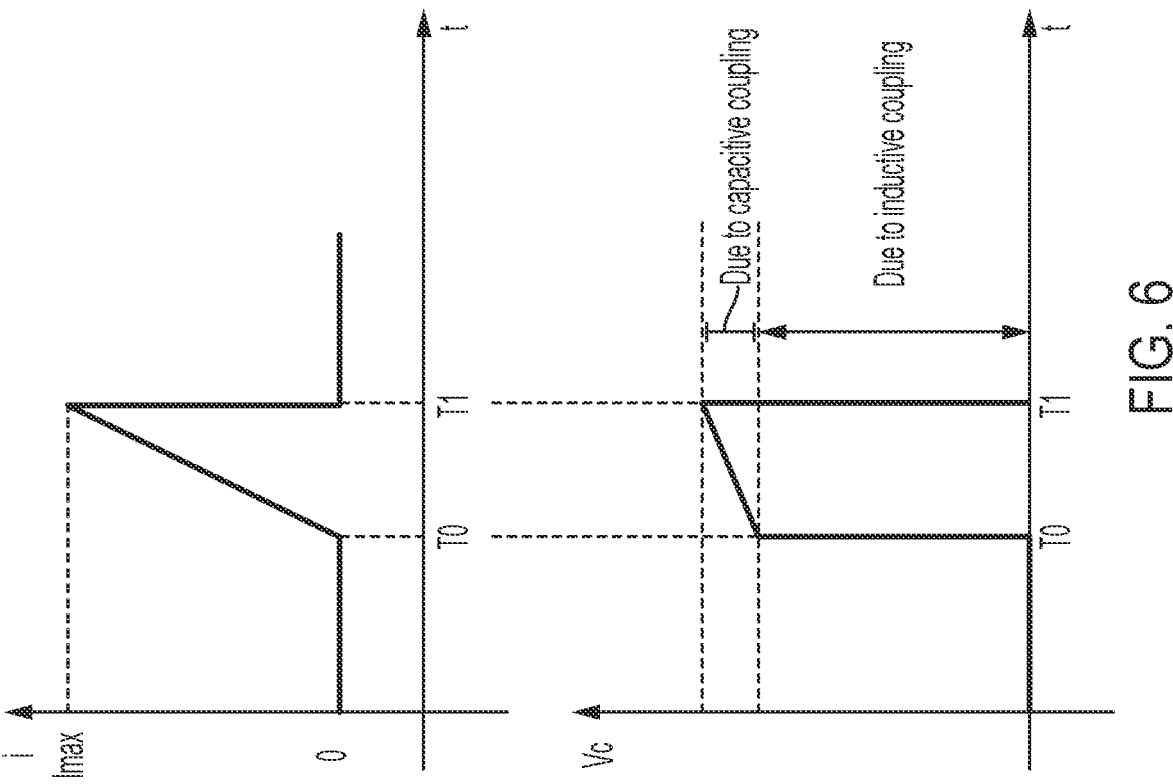
FIG. 6

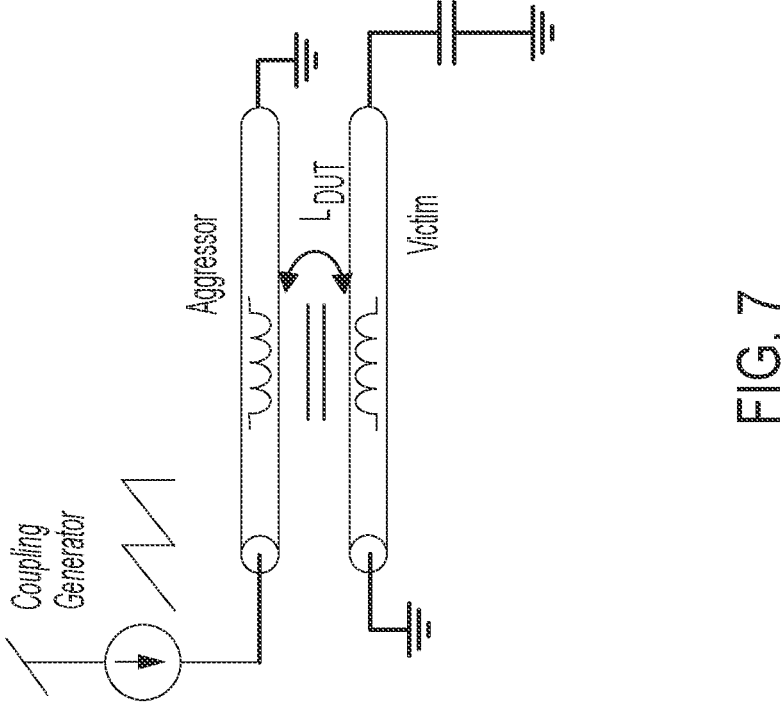
FIG. 7

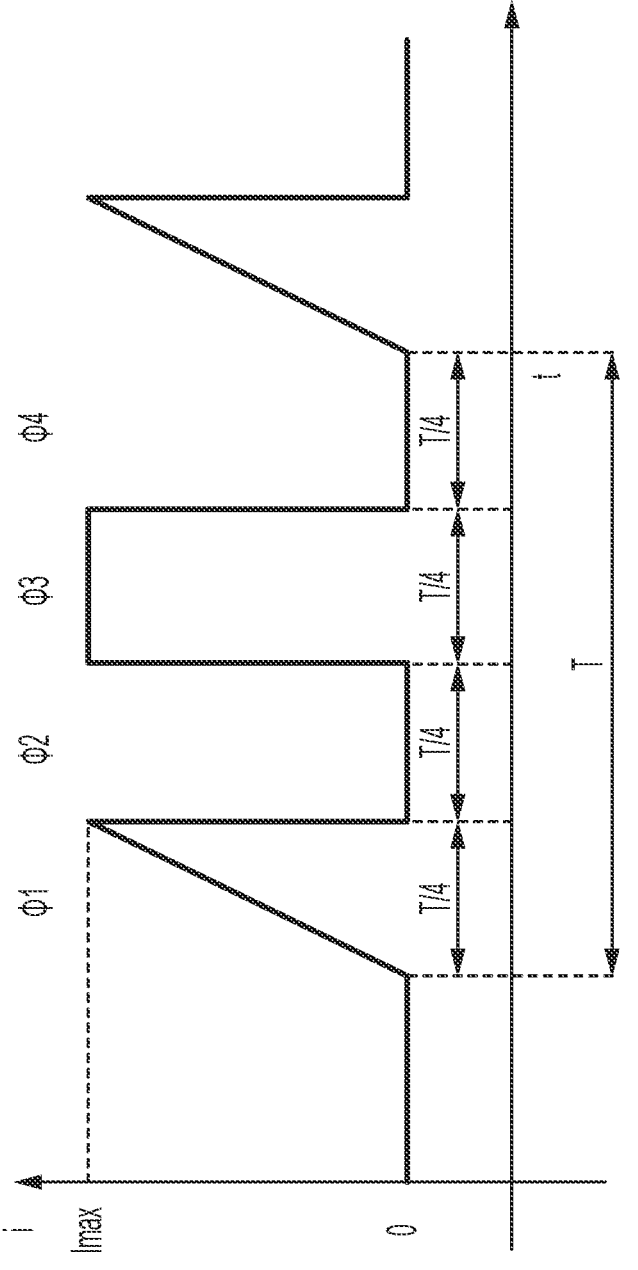
FIG. 9

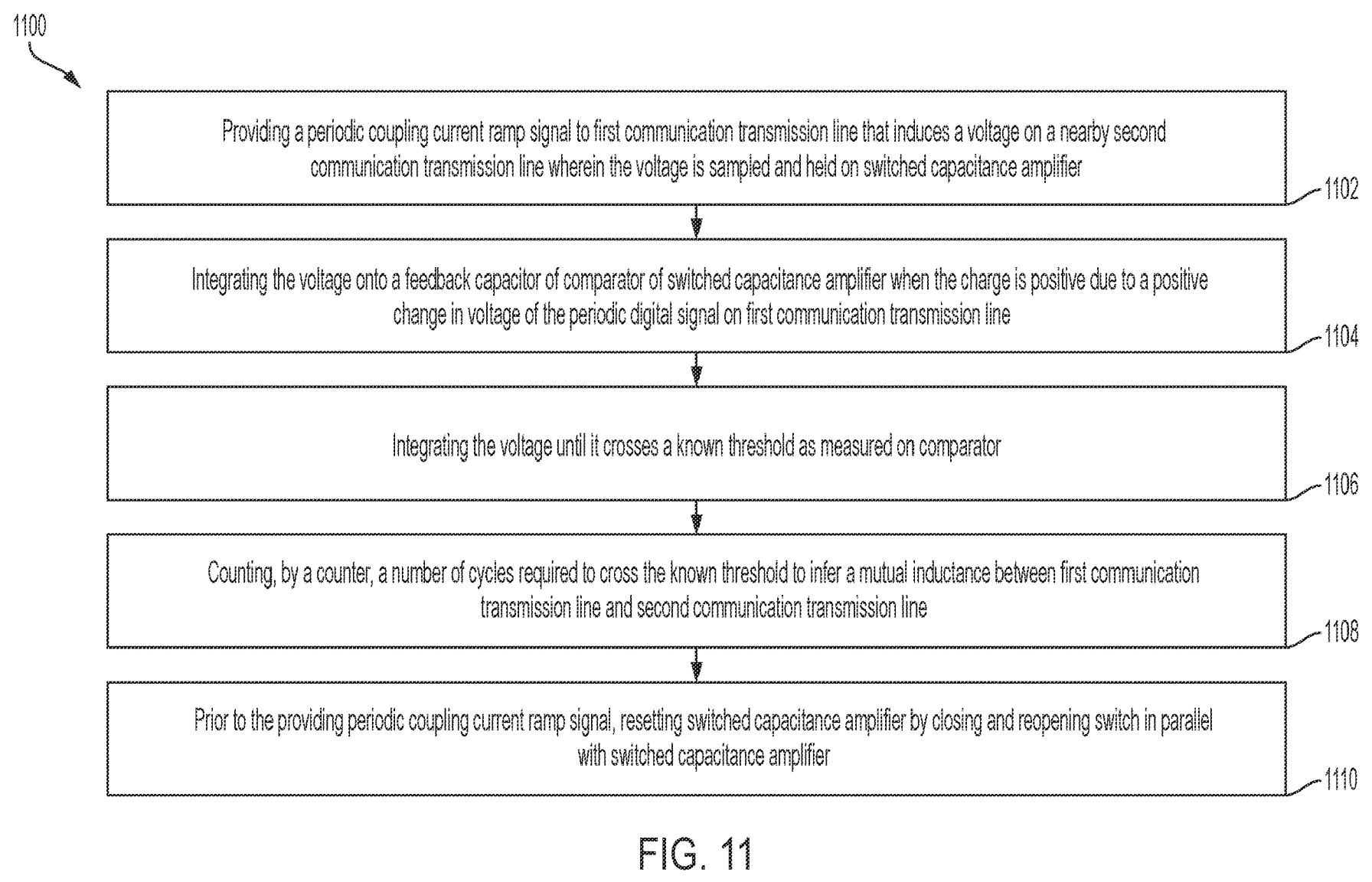

1100

1102 — Providing a periodic coupling current ramp signal to first communication transmission line that induces a voltage on a nearby second communication transmission line wherein the voltage is sampled and held on switched capacitance amplifier 1104 — Integrating the voltage onto a feedback capacitor of comparator of switched capacitance amplifier when the charge is positive due to a positive change in voltage of the periodic digital signal on first communication transmission line 1106 — Integrating the voltage until it crosses a known threshold as measured on comparator 1108 — Counting, by a counter, a number of cycles required to cross the known threshold to infer a mutual inductance between first communication transmission line and second communication transmission line 1110 — Prior to the providing periodic coupling current ramp signal, resetting switched capacitance amplifier by closing and reopening switch in parallel with switched capacitance amplifier

FIG. 11

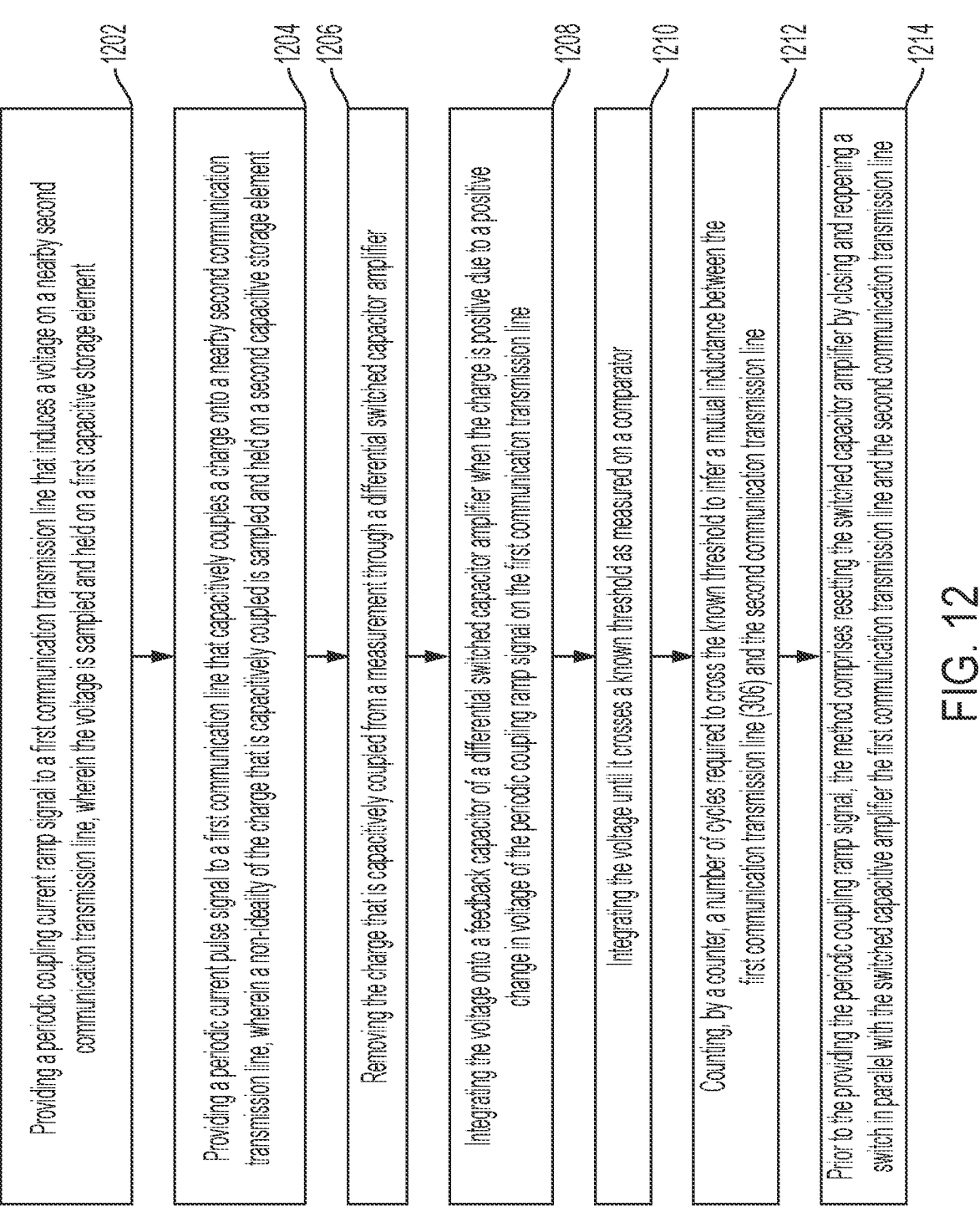

1202

Providing a periodic coupling current ramp signal to a first communication transmission line that induces a voltage on a nearby second communication transmission line, wherein the voltage is sampled and held on a first capacitive storage element

1204

Providing a periodic current pulse signal to a first communication line that capacitively couples a charge onto a nearby second communication transmission line, wherein a non-ideality of the charge that is capacitively coupled is sampled and held on a second capacitive storage element

1206

Removing the charge that is capacitively coupled from a measurement through a differential switched capacitor amplifier

1208

Integrating the voltage onto a feedback capacitor of a differential switched capacitor amplifier when the charge is positive due to a positive change in voltage of the periodic coupling ramp signal on the first communication transmission line

1210

Integrating the voltage until it crosses a known threshold as measured on a comparator

1212

Counting, by a counter, a number of cycles required to cross the known threshold to infer a mutual inductance between the first communication transmission line (306) and the second communication transmission line

1214

Prior to the providing the periodic coupling ramp signal, the method comprises resetting the switched capacitor amplifier by closing and reopening a switch in parallel with the switched capacitor amplifier the first communication transmission line and the second communication transmission line

METHODS AND APPARATUS FOR IN-SITU MEASUREMENT OF MUTUAL INDUCTANCE BETWEEN EMBEDDED INTERCONNECTS

FIELD

This application is directed to methods and apparatus for in-situ measurement of mutual inductance between embedded interconnects.

BACKGROUND

Mutual coupling/cross talk measurements are usually done with expensive test equipment that requires disconnecting signal wires from a system transmitter and receiver and connecting them to test equipment instead, and then reconnecting them back into the system. This approach tends to have many disadvantages including being both inefficient and time consuming.

While several architectures exist for in-situ measurement of coupling capacitance (e.g. charge based capacitance measurement), we believe the following is first of its kind for discerning mutual inductance between coupled nodes/wires/interconnect in embedded environments.

SUMMARY

According to examples of the present disclosure, a system for measuring mutual inductance between adjacent first communication transmission line and second communication transmission line is disclosed. The system comprises a mutual inductance measurement circuit comprising: a coupling generator (208) which biases the first communication transmission line (306) with a current ramp signal (500); a sample and hold circuit (212) which captures an induced voltage on the second communication transmission line (308) using a switched capacitor storage element; a switched capacitor integrator configured to integrate the induced voltage onto an output voltage node; and a comparator (214) configured to switch states once the switched capacitor integration has surpassed a reference trippoint.

The system can include one or more of the following features. The system can further comprise a coupling generator which utilizes a DC current source and a capacitor to generate a linear voltage ramp and an op-amp feedback circuit which performs voltage-to-current conversion to generate the current ramp signal. The current ramp signal on the first communication transmission line induces a voltage on the second communication transmission line. The first communication transmission line is an aggressor line. The second communication transmission line is a victim line. The first communication transmission line and the second communication transmission line are high-speed analog communications channels. The first communication transmission line and the second communication transmission line are digital communications channels. The digital communications channels comprise application-specific integrated circuits (ASICs) or field programmable gate arrays (FPGAs). The system comprises a processor configured to receive an output from the voltage comparator and determine the magnitude of mutual inductance. The voltage comparator is a dynamic, clocked voltage comparator.

According to examples of the present disclosure, a method to determine a mutual inductance between a first communication transmission line and a second communication transmission line is disclosed. The method comprises providing a periodic coupling current ramp signal to a first communication transmission line that induces a voltage on a nearby second communication transmission line, wherein the voltage is sampled and held on a capacitor; integrating the voltage onto a feedback capacitor of a switched capacitor integrator when the charge is positive due to a positive change in voltage of the periodic coupling ramp signal on the first communication transmission line; integrating the voltage until it crosses a known threshold as measured on a comparator; and counting a number of cycles required to cross the known threshold to infer a mutual inductance between the first communication transmission line and the second communication transmission line.

The method can include one or more the following features. Prior to the providing the periodic coupling ramp signal, the method comprises resetting the switched capacitor integrator by closing and reopening a switch in parallel with the switched capacitive integrator. The first communication transmission line is an aggressor line. The second communication transmission line is a victim line. The first communication transmission line and the second communication transmission line are high-speed analog communications channels. The first communication transmission line and the second communication transmission line are digital communications channels. The digital communications channels comprise application-specific integrated circuits (ASICs) or field programmable gate arrays (FPGAs). The method further comprising receiving, at a processor, an output from the voltage comparator circuit and determining a capacitive-based coupling.

According to examples of the present disclosure, a method to determine a mutual inductance between a first communication transmission line and a second communication transmission line is disclosed. The method comprising: providing a periodic coupling current ramp signal to a first communication transmission line that induces a voltage on a nearby second communication transmission line, wherein the voltage is sampled and held on a first capacitive storage element; providing a periodic current pulse signal to a first communication line that capacitively couples a charge onto a nearby second communication transmission line, wherein a non-ideality of the charge that is capacitively coupled is sampled and held on a second capacitive storage element; removing the charge that is capacitively coupled from a measurement through a differential switched capacitor integrator; integrating the voltage onto a feedback capacitor of a differential switched capacitor integrator when the charge is positive due to a positive change in voltage of the periodic coupling ramp signal on the first communication transmission line; integrating the voltage until it crosses a known threshold as measured on a comparator; and counting a number of cycles required to cross the known threshold to infer a mutual inductance between the first communication transmission line and the second communication transmission line. Prior to the providing the periodic coupling ramp signal, the method comprises resetting the differential switched capacitor integrator by closing and reopening a switch in parallel with the capacitor integrator.

BRIEF DESCRIPTION OF THE FIGURES

FIG. 6 shows a plot of voltage versus time for the voltage induced in the victim line from the aggressor line according to examples of the present disclosure.

FIG. 7 shows a diagram for generating the voltage induced in the victim line according to examples of the present disclosure.

FIG. 9 shows a timing diagram for FIG. 9, which shows an interleaved current signal for when switches are operated according to timing signals $\phi_1$, $\phi_2$, $\phi_3$, $\phi_4$ that determine the opening and closing of the respective switches according to examples of the present disclosure.

FIG. 11 show a flowchart for a method according to examples of the present disclosure.

FIG. 12 shows a flowchart for a method to determine a mutual inductance between a first communication line and a second communication line according to examples of the present disclosure.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Generally speaking, examples of the present disclosure provide for a system, device, in-situ method for measuring mutual inductance between embedded interconnects. As opposed to a single shot measurement, the examples circuit architectures repeats the measurement numerous times and averages the result to improve measurement resolution and noise floor, relying on the fact that coupling properties are relatively static, i.e. low bandwidth. The architectures also leverage numerous forms of correlated double sampling and auto-zeroing to remove systematic artifacts and circuit non-idealities (e.g., capacitive coupling, amplifier offset voltage, switching injection noise, etc.). Also, examples of the present disclosure provide for the characterization of critical high-speed, high-density interconnect which cannot presently be characterized in their deeply embedded platform (e.g. 2.5D/3D advanced packaging systems). The example systems, devices, and methods are low power, low area, and scalable to many parallel interconnect-essentially providing this new characterization functionality with minimal disruption to existing system.

The measurement operates on the simplest of principles, applying a steady ramp of current (dI/dt) to induce a voltage (V) on a coupled line with mutual inductance ($L_M$), as $V=L_M \times dI/dt$. Given a known current ramp, by taking a measurement of the induced voltage we can calculate the mutual inductance. The circuit architecture integrates the induced voltage over many discrete samples to improve measurement resolution and noise floor, and also leverages correlated double sampling to remove system artifacts.

Figure 1:
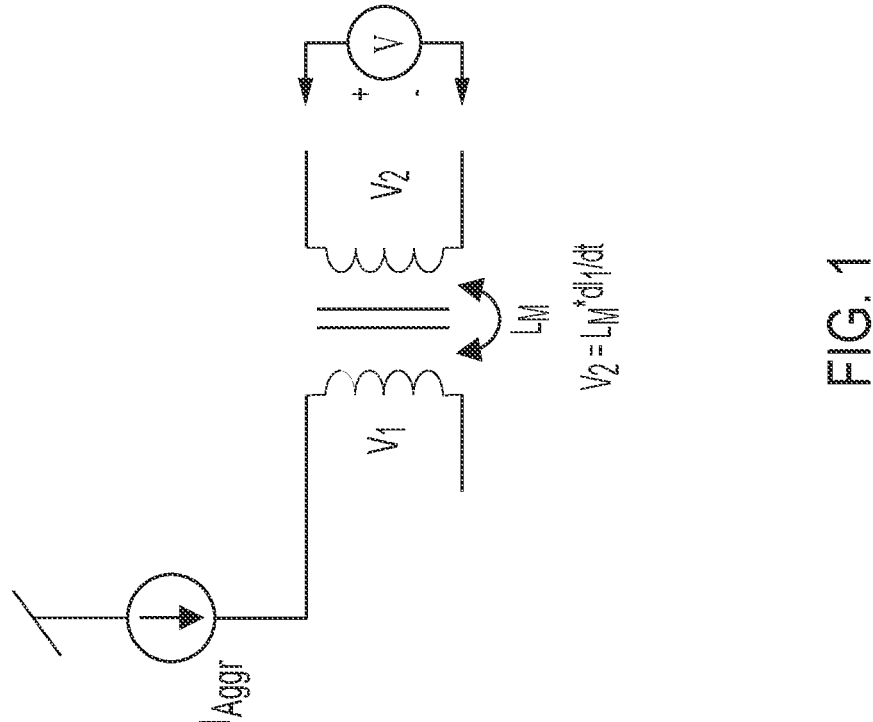
FIG. 1 shows a conventional model for inductively coupled wires.

FIG. 1 shows a model for inductively coupled wires. Any two communication transmission lines that are in vicinity of each other will be mutually coupled. This coupling effect can be both capacitive and inductive. Depending on the application, communication transmission lines need to be calibrated accurately where two coupled lines would have different impedance than each one separately. Tools like network analyzer can be used to calibrate the line however there are devices and applications that will be hard or impossible to calibrate the line using VNA. In this design the goal is to design an integrated circuit to calibrate the connection lines.

Based on the formula above, if a current is applied with constant rate of change the potential that will be built in the second line will be constant. This means that if we measure the voltage knowing the current rate of change the mutual inductance could be calculated. For this reason, a current ramp generator needs to be designed.

If the induced voltage is measured, then the coupled inductance can be found as follows:

$$di/dt = I_{max}/(T_1 - T_0)$$

$$L_{coupled} = V_{coupled} * (T_1 - T_0)/I_{max}$$

The voltage induced is proportional to the current rate of change. To maximize the induced voltage we have to maximize the slope of the ramp current. This will result in limiting voltage that will be built on the victim line. For example, for a 1 nH coupled inductance, a current ramp with Imax=1 mA and $(T_1-T_0)=100$ ns, the voltage that will be built in the victim line is 10 uV. This is too small to be measured directly therefore instead of measuring directly; using capacitor and integrator we can integrate charge for N cycles. A powerful thing about using an integrator is the fact that as the number of cycles goes up the signal to noise ratio will increase. This will help us to measure the voltage built in the victim line.

Let say after N cycle the voltage built on integrator cap is $V_{sum}$ then we have:

$$Q_{sum} = V_{sum} * C_1$$

$$q = Q_{sum}/N$$

$$V_{coupled} = q/C_2$$

$$V_{coupled} = (V_{sum} * C_1)/(N * C_2)$$

$$L_{coupled} = V_{coupled} * (T_1 - T_0)/I_{max}$$

$$L_{coupled} = (V_{sum} * C_1 * (T_1 - T_0))/(I_{max} * N * C_2)$$

Due to the ohmic impedance of the line it will build some potential differences between two lines. This means that some of the voltage in the victim line is due to capacitive coupling.

Figure 2:
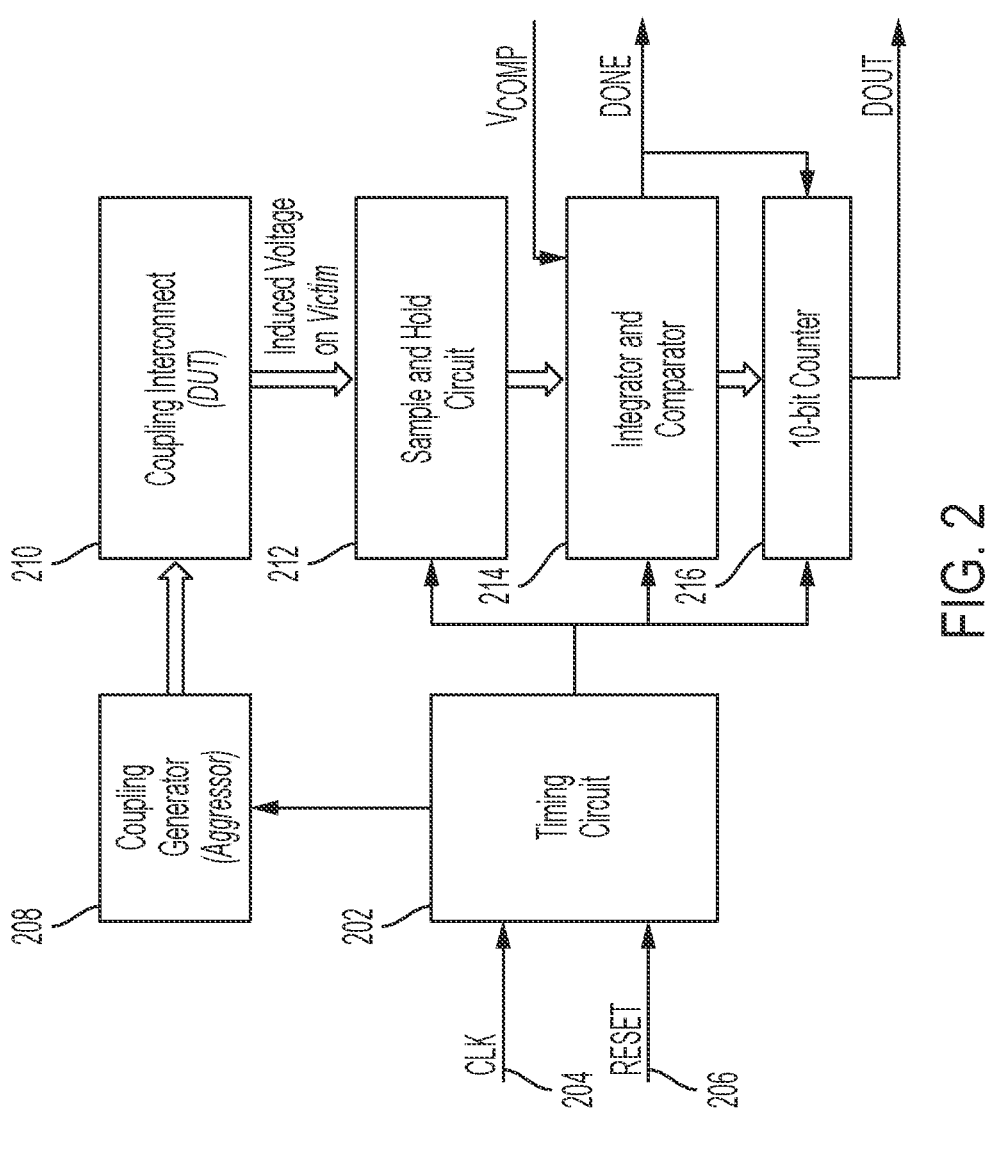
FIG. 2 shows a block diagram circuit configuration according to examples of the present disclosure.

FIG. 2 shows a block diagram circuit configuration 200 according to examples of the present disclosure. As shown in FIG. 2, the circuit comprises timing circuit 202 that has two inputs, namely clock signal input 204 and reset input 206. Output from timing circuit 202 is provided to coupling generator (aggressor) 208, which biases a first communication transmission line with a current ramp signal, as discussed further below. Output from coupling generator (aggressor) 208 is provided to coupling interconnect (DUI) 210. Output from coupling interconnect (DUI), which represents the induced voltage to the victim line, is provided to sample and hold circuit 212. Output from sample and hold circuit 212 is provided to integrator and comparator 214. Output from integrator and comparator 214 is provided to 10-bit counter 216. Output from 10-bit counter 216 is Dout Output from timing circuit 202 is also provided to sample and hold circuit 212, integrator and comparator 214, and 10-bit counter 216. Counter 216 counts a number of cycles required to cross the known threshold to infer a mutual inductance between a first communication transmission line and a second communication transmission line.

Figure 3:
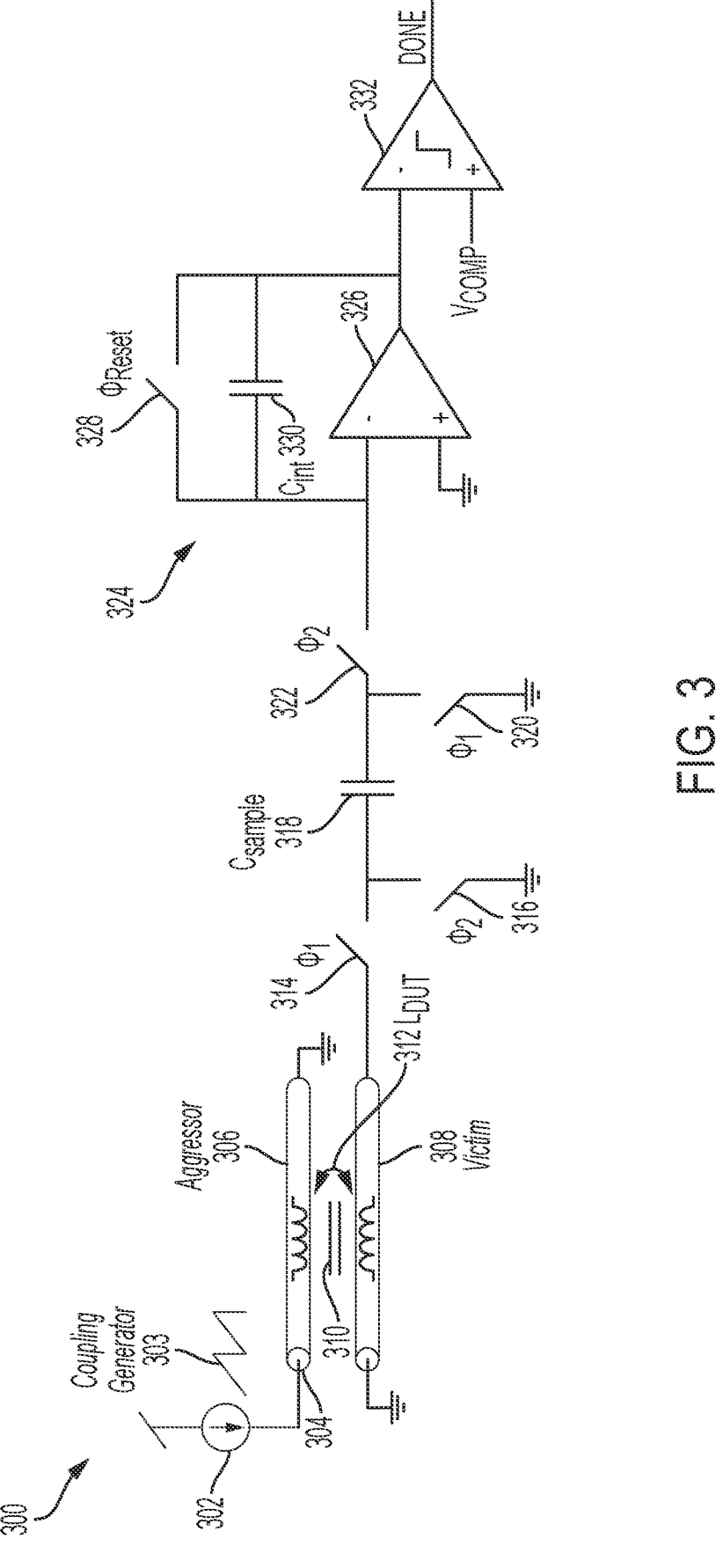
FIG. 3 shows an example circuit configuration of FIG. 2 according to examples of the present disclosure.
Figure 4:
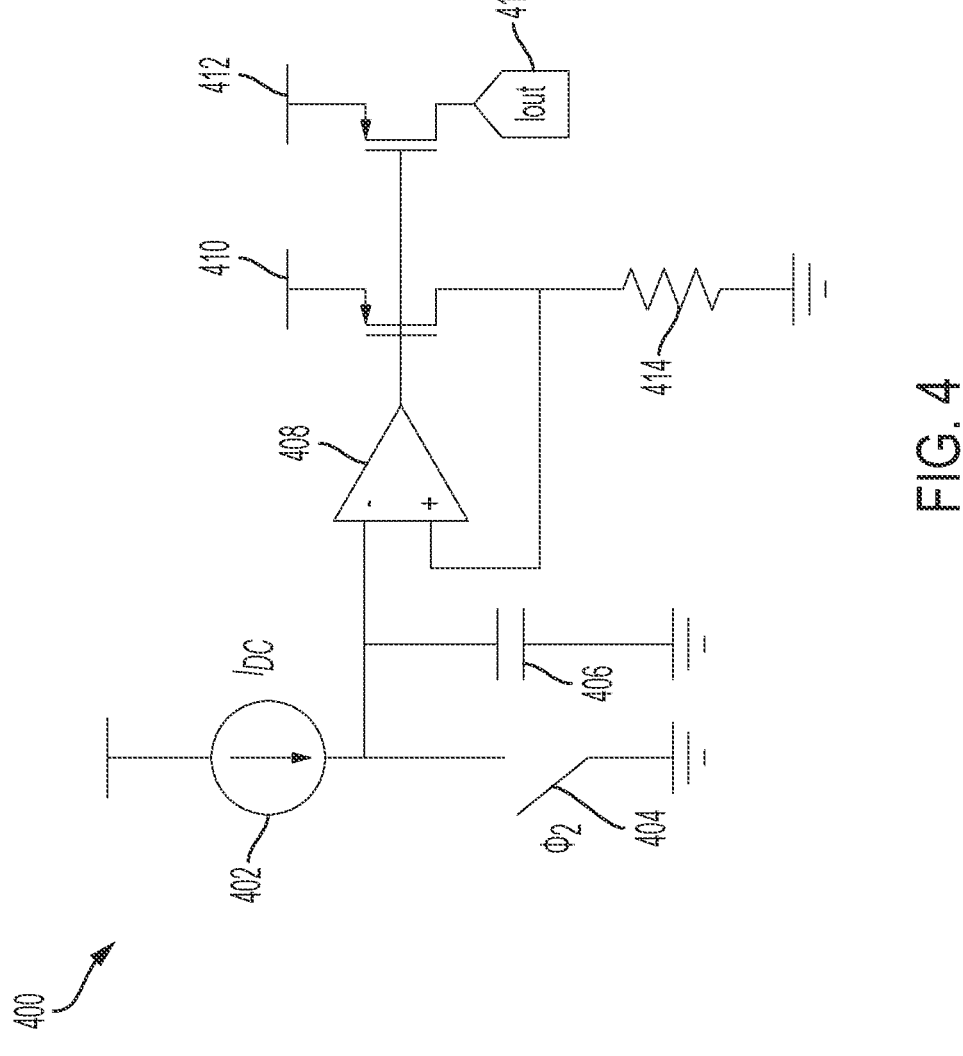
FIG. 4 shows an example coupling generator circuit configuration of the coupling generator FIG. 3 according to examples of the present disclosure.

FIG. 3 shows an example circuit configuration 300 of FIG. 2 according to examples of the present disclosure. As shown in FIG. 3, an aggressor signal 302 generated by coupling generator 303, such as coupling generator as shown in FIG. 4, is provided to receive end 304 of first communication transmission line 306 (e.g., aggressor line). For example, the aggressor signal 302 is a periodic analog current ramp signal. First communication transmission line 306 is near second communication transmission line 308 (e.g., victim line) in a parallel arrangement. Mutual inductance 310, denoted by $L_{DUT}$, between first communication transmission line 306 and second communication transmission line 308 is measured by using a switched measurement architecture at transit end 312 of second communication transmission line 308. Aggressor signal 302 induces an electromotive force (emf) in second communication line 308 (e.g., victim line), wherein the voltage is sampled through onto a sampling capacitor.

The signal output at transmit end 312 of victim line 308 is provided to switch 314 that is operated according to first timing signal denoted by $\phi_1$, switch 316 that is operated according to second timing signal denoted by $\phi_2$, capacitor 318, denoted by $C_{sample}$, switch 320 that is operated according to first timing signal denoted by $\phi_1$, and switch 322 that is operated according to second timing signal denoted by $\phi_2$. Capacitor 318, denoted by $C_{sample}$, is charged when switch 314 is closed according to first timing signal, denoted by $\phi_1$, and switch 316 is closed according to second timing signal, denoted by $\phi_2$. When switch 314 is closed according to first timing signal, denoted by $\phi_1$, switch 316 is closed according to second timing signal, denoted by $\phi_2$, switch 320 is closed according to first timing signal, denoted by $\phi_1$, and switch 322 is closed according to second timing signal, denoted by $\phi_2$, the signal is provided to switched capacitance integrator 324 that comprises amplifier 326, switch 328 that is operated according to reset timing signal, denoted by $\phi_{Reset}$, and capacitor 330, denoted by $C_{int}$. Capacitor 330, denoted by $C_{int}$, is charged when switch 328 is closed according to reset timing signal, denoted by $\phi_{Reset}$. The output of switched capacitance integrator 324 is provided to comparator 332. In this example, switch 314, switch 316, capacitor 318, switch 320 comprise sample and hold circuit 212 and switch 322, switched capacitance integrator 324, amplifier 326, switch 328, and comparator 332 comprise integrator and comparator 214.

Figure 5:
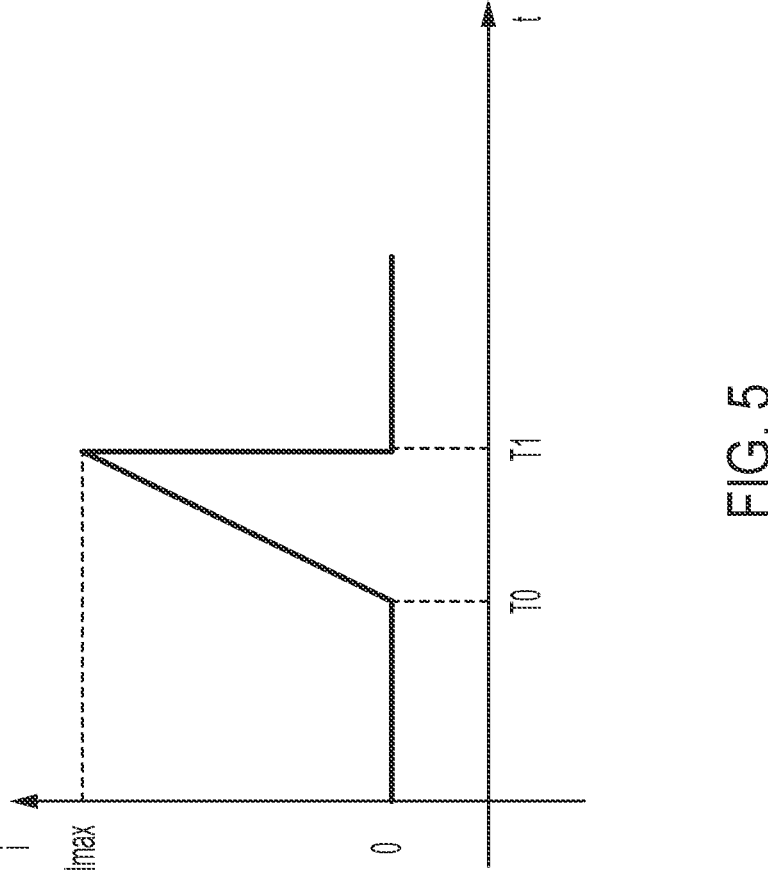
FIG. 5 shows a current ramp according to example of the present disclosure.

FIG. 4 shows an example coupling generator 400 of the coupling generator FIG. 3 according to examples of the present disclosure. Coupling generator 400 uses a DC current source 402 and capacitor 406 to generate a linear voltage ramp and uses op-amp feedback circuit 48 to perform a voltage-to-current conversion to generate a current ramp signal (as shown in FIG. 5). In operation, when switch 404 is closed, DC current source 402 produces a direct current that charges capacitor 406 that produces a linear voltage ramp signal, which is used by op-amp feedback circuit 408 and first transistor 410 and second transistor, which can be P-type metal-oxide-semiconductor logic (PMOS or pMOS) field-effect transistors (FETs) that are configured to function as variable current sources, and resistor 414 to perform the voltage-to-current conversion to generate the current ramp signal that is outputted current ramp output, as denoted by Iout 416.

FIG. 5 shows a current ramp signal 500 according to example of the present disclosure. Aggressor signal 302 generated by the coupling generator of FIG. 3, such as coupling generator circuit configuration 400, comprises a known linear ramp of current (dI/dt), such as shown in FIG. 5, on an aggressor line 306 and switched capacitance integrator 324 measures the voltage developed on the nearby Victim line, governed by V=Lm(dI/dt). In order to improve measurement resolution, the voltage is captured and averaged multiple times through a switch capacitor integrator circuit. The operations of FIG. 3 run until the integrated voltage crosses a known reference and trips a dynamic latched comparator executed by comparator 332. Additionally, the correlated double sampling techniques from the CBCM can be used in a similar fashion to remove charge injection, op-amp flicker noise, etc.

Assuming comparator 332 yield infinite resolution, the measurement noise floor would be limited by non-linearity in the current ramp circuit. Bias network, e.g., first communication transmission line 306 and second communication transmission line 308 of FIG. 3, forces switched capacitance integrator 324 to track a linear voltage ramp at coupling generator 303. Also, examples in accordance with the present architecture can be integrated in a number of parallel interconnect in an embedded environment. Since the measurement circuit is near-DC, an insitu topology can be used with one measurement circuit that multiplexes the aggressor and victim nodes to any possible combination of parallel interconnects.

FIG. 6 shows a plot of voltage versus time for the voltage induced in the victim line 308 from the aggressor line 306 according to examples of the present disclosure. To calibrate the voltage that was built due to coupling capacitance, a step current, as shown in FIG. 6, with the same amplitude can be applied. From low to high, the mutual inductance will induce a high voltage, beginning at T0, but it will settle to zero quickly, beginning at T1. The voltage remaining will be almost but not exactly equal to the capacitive voltage induced during ramp current.

FIG. 7 shows a diagram for generating the voltage induced in the victim line 700 according to examples of the present disclosure. As shown in FIG. 7, an aggressor signal 702, such as the signals shown in FIG. 6, is generated by a coupling generator, such as coupling generator as shown in FIG. 4, is provided to receive end 304 of aggressor line 306. Aggressor line 306 is near victim line 308 in a parallel arrangement. The signal is then outputted at transmit end 312 of victim line 308.

Figure 8:
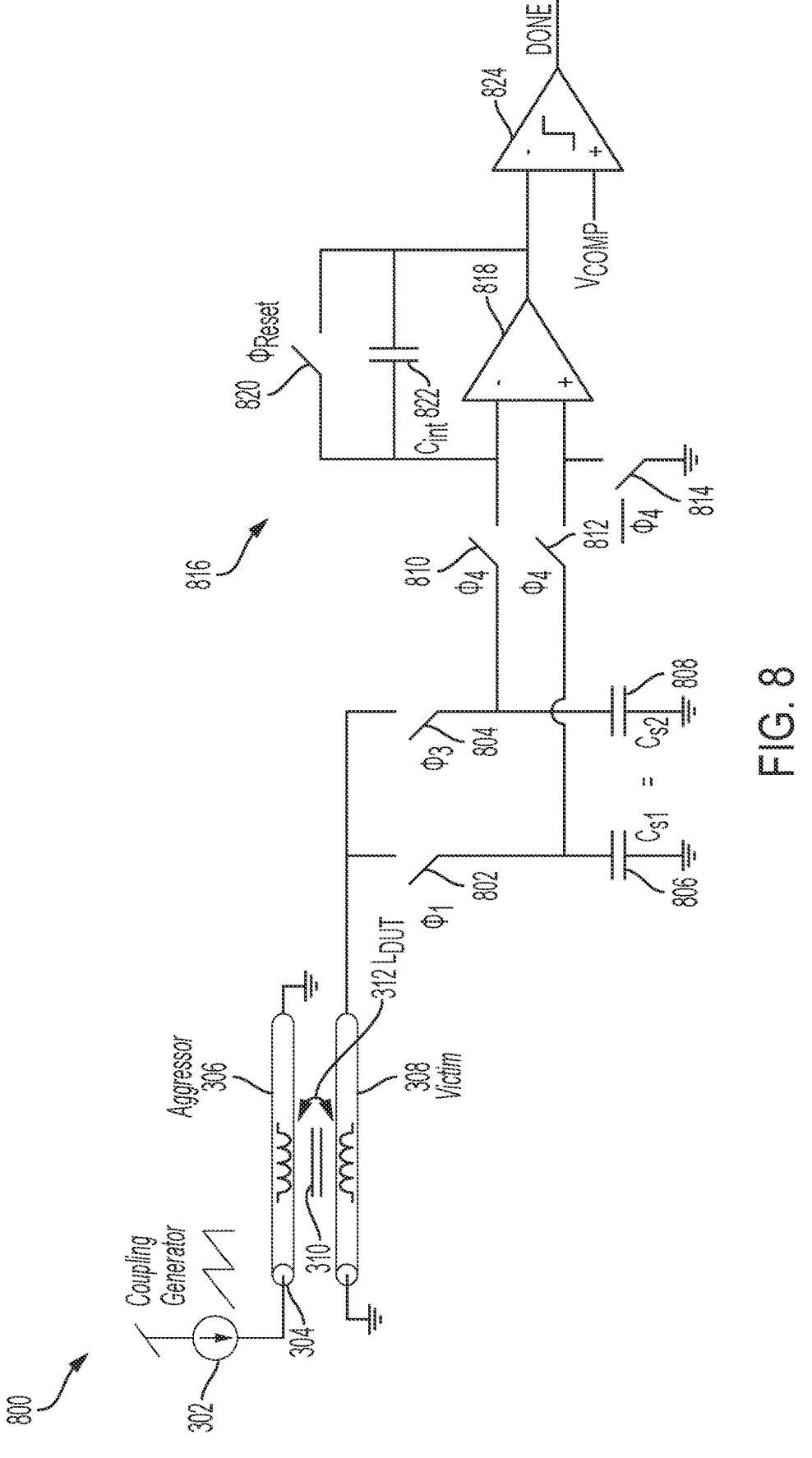
FIG. 8 shows another example circuit configuration of FIG. 2 according to examples of the present disclosure.

FIG. 8 shows another example circuit configuration 800 of FIG. 2 according to examples of the present disclosure. As shown in FIG. 8, an aggressor signal 302 generated by a coupling generator, such as coupling generator as shown in FIG. 4, is provided to receive end 304 of aggressor line 306. Aggressor line 306 is near victim line 308 in a parallel arrangement. Mutual inductance 310, denoted by $L_{DUT}$, between aggressor line 306 and victim line 308 is measured by using a switched measurement architecture at transit end 312 of victim line 308. The signal output at transmit end 312 of victim line 308 is provided to switch 802 that is operated according to first timing signal, denoted by $\phi_1$, and switch 804 that is operated according to third timing signal, denoted by $\phi_3$. Capacitor 806, denoted by $C_{s1}$, is charged when switch 802 is closed according to first timing signal, denoted by $\phi_1$, and capacitor 808, denoted by $C_{s2}$, is charged when switch 804 is closed according to second timing signal, denoted by $\phi_2$. When switch 802 is closed according to first timing signal, denoted by $\phi_1$, and switch 804 is closed according to third timing signal, denoted by $\phi_3$, a voltage is provided to switch 810 that is operated according to fourth timing signal, denoted by $\phi_4$, and switch 812 that is operated according to fourth timing signal, denoted by $\phi_4$, respectively. When switch 802 is closed according to first timing signal, denoted by $\phi_1$, and switch 804 is closed according to second timing signal, denoted by $\phi_2$ a voltage is provided to switch 810, that is operated according to fourth timing signal, denoted by $\phi_4$, and switch 812 that is operated by fourth timing signal, denoted by $\phi_4$, respectively. When switch 802 is closed according to first timing signal, denoted by $\phi_1$, switch 804 is closed according to third timing signal, denoted by $\phi_3$, switch 810 is closed according to fourth timing signal, denoted by $\phi_4$, switch 812 is closed according to fourth timing signal, denoted by $\phi_4$, and switch 814 is closed according to fourth timing signal, denoted by $\phi_4$, a voltage is provided to differential switched capacitive integrator 816 that is operated according to reset timing signal, denoted by $\phi_{Reset}$, and feedback capacitor 822, denoted by $C_{int}$. Feedback capacitor 822, denoted by $C_{int}$, is charged when switch 820 is closed according to reset timing signal, denoted by $\phi_{Reset}$. The output of differential switched capacitance integrator 816 is provided to comparator 824. In this example, switch 802, switch 804, capacitor 806, capacitor 808 comprise sample and hold circuit 212 and switch 810, switch 812, switch 814, amplifier 818, switch 820, and feedback capacitor 822 comprise differential switched capacitor integrator 816. Switch 810, switch 812, switch 814, amplifier 818, switch 820, feedback capacitor 822, and comparator 824 comprise integrator and comparator 214.

FIG. 9 shows a timing diagram for FIG. 8, which shows an interleaved current signal for when the various switches are operated according to first timing signal, denoted by $\phi_1$, second timing signal, denoted by $\phi_2$, third timing signal, denoted by $\phi_3$, and fourth timing signal, denoted by $\phi_4$. One solution to the issues discussed above with relation to FIG. 6, can be interleaving these two currents and subtracting the two voltages from each other. In this example, additional switches and capacitors are used to store each voltage separately, as shown in FIG. 8.

Using ideal components, the circuit above was able to measure the coupled inductance. For coupled lines a two mutually coupled inductance with inductive coefficient of 1 being used. From experimental results, it is determined that there is a linear relationship between measured inductance and actual inductance. The difference between measured and actual inductance is not surprising because of using large transistors for switches which introduce parasitic caps and having non-zero impedance when turned on. The slope and offset that exist here are systematic errors which can be calibrated later.

Figure 10:
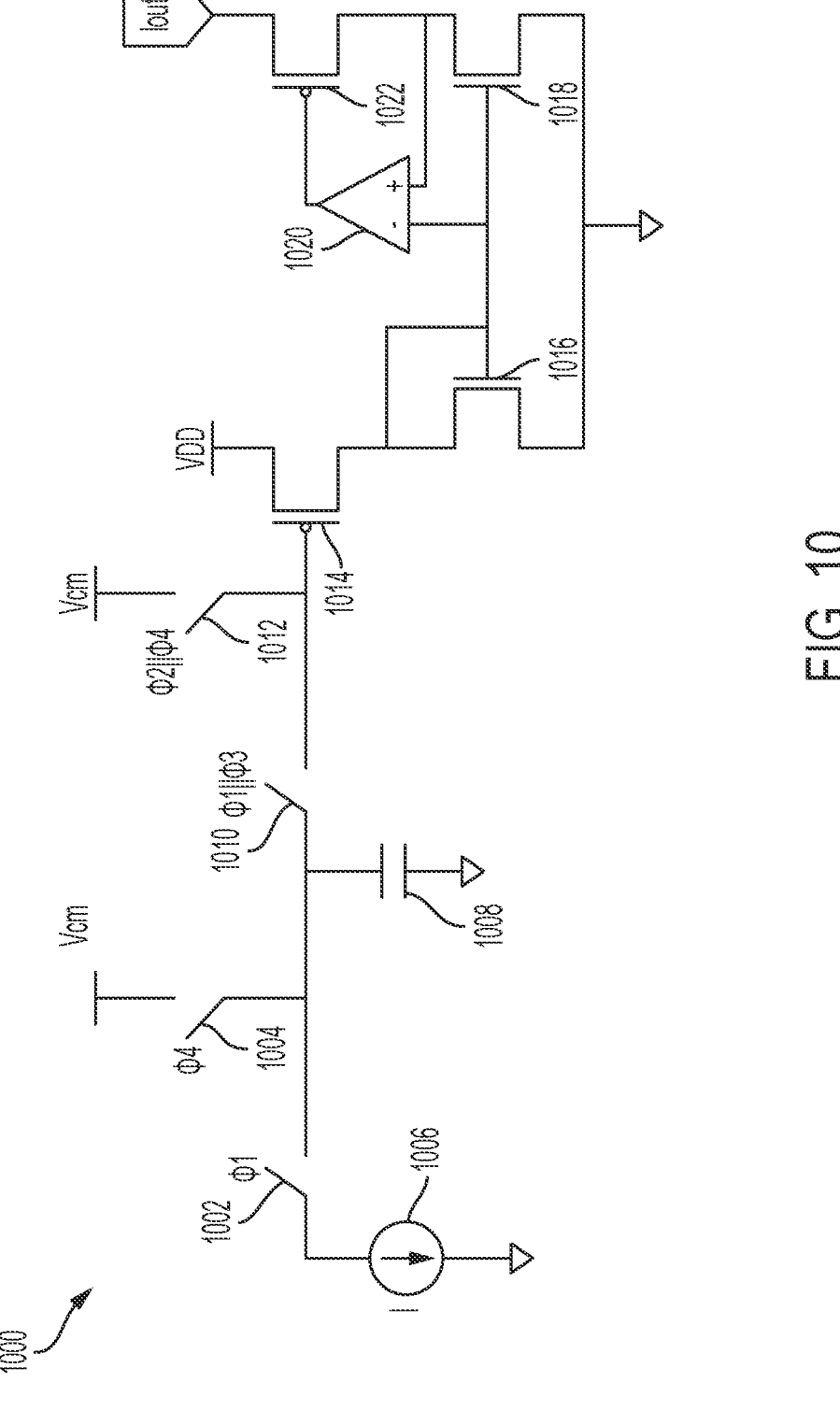
FIG. 10 shows a current signal generator according to examples of the present disclosure.

FIG. 10 shows a current signal generator 1000 according to examples of the present disclosure. When switch 1002 and switch 1004 are closed, capacitor 1006 is charged. When switch 1002, switch 1004, switch 1008, and switch 1010, PMOS 1012 and PMOS 1014 provide an input signal to amplifier 1018 that outputs an output signal to PMOS 1016, where the output signal is representative to a voltage by inductance coupling that is proportional to the slope of the ramp current. After running some simulation on mutually coupled lines model from rfTlineLib in cadence, a current source with 1 mA peak to peak amplitude and 400 ns was able to create a detectable voltage in the victim line with length of as small as a few 100 μm. The current source needed to be designed to provide minimum 1 mA peak to peak current and with a period of 400 ns. The current reference that has been used in this current signal generator is PTAT to cancel out the CTAT property of the circuit. This will make sure that the peak-to-peak current is constant with temperature variation.

FIG. 11 shows a method 1100 to determine a mutual inductance between first communication line 306 and second communication line 308. Method 1100 comprising providing periodic coupling current ramp signal 302 to first communication transmission line 306 that induces a voltage on a nearby second communication transmission line 308 wherein the voltage is sampled and held on switched capacitance integrator 324, as in 1102.

Method 1100 continues by integrating the voltage onto a feedback capacitor 330 of comparator 332 of switched capacitance integrator 324 when the charge is positive due to a positive change in voltage of the periodic digital signal on first communication transmission line 306, as in 1104.

Method 1100 continues by integrating the voltage until it crosses a known threshold as measured on comparator 322, as in 1106.

Method 1100 continues by counting, by counter 216, a number of cycles required to cross the known threshold to infer a mutual inductance between first communication transmission line 306 and second communication transmission line 308, as in 1108.

Method 1100 can continue prior to the providing periodic coupling current ramp signal 302 as in 1102, method 1100 comprises resetting switched capacitance integrator 324 by closing and reopening switch 328 in parallel with switched capacitance integrator 324, as in 1110.

Method 1100 can continue by receiving, at a processor, an output from the voltage comparator circuit and determining a capacitive-based coupling, as in 1112.

FIG. 12 shows a method 1200 to determine a mutual inductance between a first communication line and a second communication line according to examples of the present disclosure. Method 1200 comprises providing a periodic coupling current ramp signal to a first communication transmission line (306) that induces a voltage on a nearby second communication transmission line (308), wherein the voltage is sampled and held on a first capacitive storage element (806), as in 1202. Method 1200 continues by providing a periodic current pulse signal to a first communication line (306) that capacitively couples a charge onto a nearby second communication transmission line (308), wherein a non-ideality of the charge that is capacitively coupled is sampled and held on a second capacitive storage element (808), as in 1204. Method 1200 continues by removing the charge that is capacitively coupled from a measurement through a differential switched capacitor integrator (816), as in 1206. Method continues by integrating the voltage onto a feedback capacitor (822) of a differential switched capacitor integrator (816) when the charge is positive due to a positive change in voltage of the periodic coupling ramp signal on the first communication transmission line (306), as in 1208. Method 1200 continues by integrating the voltage until it crosses a known threshold as measured on a comparator (820), as in 1210. Method 1200 continues by counting, by counter 216, a number of cycles required to cross the known threshold to infer a mutual inductance between the first communication transmission line (306) and the second communication transmission line (308), as in 1212. In some examples, method 1200 comprises, wherein prior to the providing the periodic coupling ramp signal, the method comprises resetting the switched capacitor integrator (324) by closing and reopening a switch (328) in parallel with the switched capacitive integrator (324), as in 1214.

Figure 13:
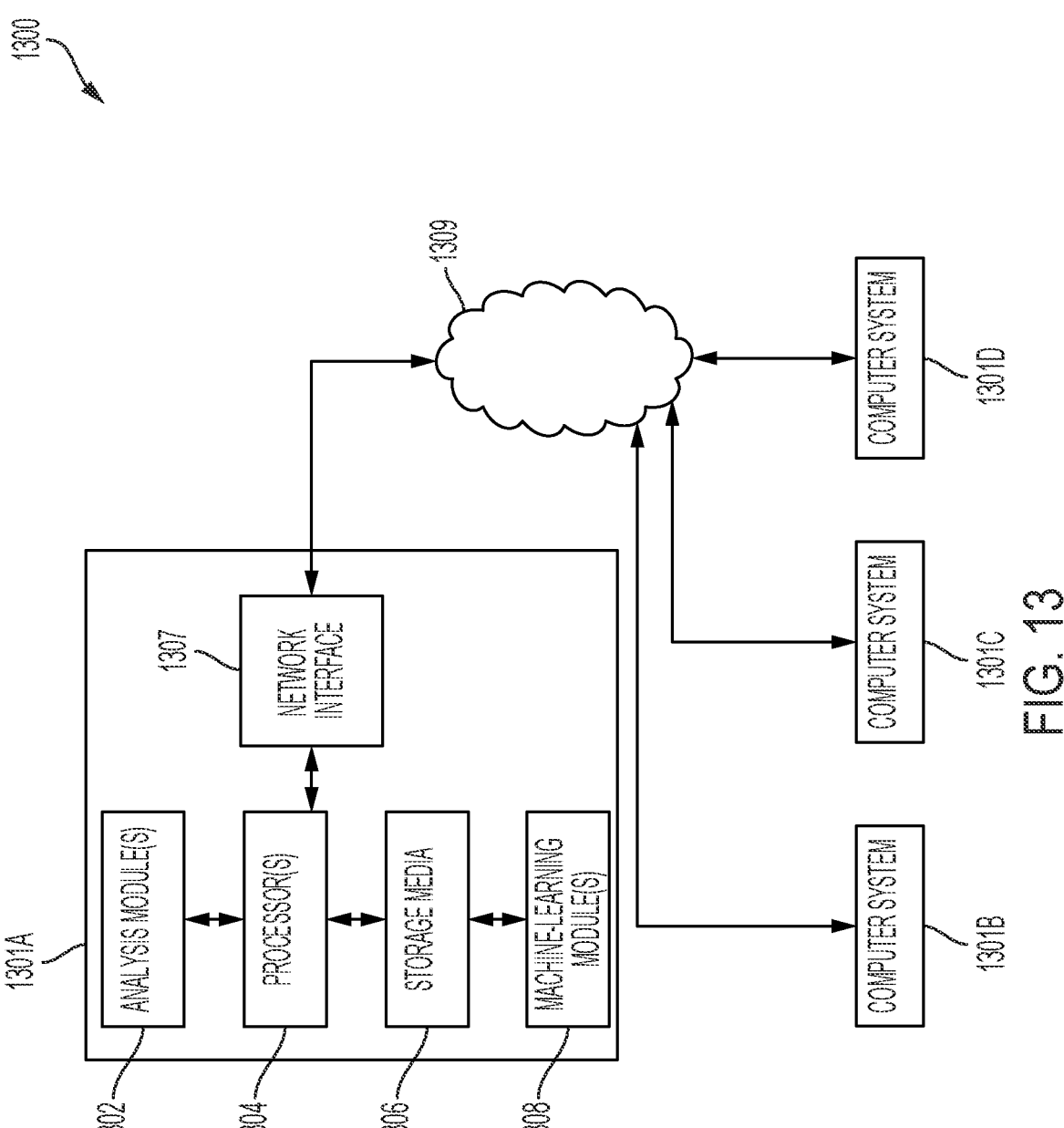
FIG. 13 shows a computing system according to examples of the present disclosure.

In some embodiments, any of the methods of the present disclosure may be executed by a computing system. FIG. 13 illustrates an example of such a computing system 1300, in accordance with some embodiments. The computing system 1300 may include a computer or computer system 1301A, which may be an individual computer system 1301A or an arrangement of distributed computer systems. The computer system 1301A includes one or more analysis module(s) 1302 configured to perform various tasks according to some embodiments, such as one or more methods disclosed herein. To perform these various tasks, the analysis module 1302 executes independently, or in coordination with, one or more hardware processors 1304, which is (or are) connected to one or more non-transitory computer readable medium 1306, such as a computer storage media. The hardware processor(s) 1304 is (or are) also connected to a network interface 1307 to allow the computer system 1301A to communicate over a data network 1309 with one or more additional computer systems and/or computing systems, such as 1301B, 1301C, and/or 1301D (note that computer systems 1301B, 1301C and/or 1301D may or may not share the same architecture as computer system 1301A, and may be located in different physical locations, e.g., computer systems 1301A and 1301B may be located in a processing facility, while in communication with one or more computer systems such as 1301C and/or 1301D that are located in one or more data centers, and/or located in varying countries on different continents). A processor can include a microprocessor, microcontroller, processor module or subsystem, programmable integrated circuit, programmable gate array, or another control or computing device.

The non-transitory computer readable medium 1306 can be implemented as one or more computer-readable or machine-readable storage media. The non-transitory computer readable medium 1306 can be connected to or coupled with a machine learning module(s) 1308. Note that while in the example embodiment of FIG. 13 non-transitory computer readable medium 1306 is depicted as within computer system 1301A, in some embodiments, non-transitory computer readable medium 1306 may be distributed within and/or across multiple internal and/or external enclosures of computing system 1301A and/or additional computing systems. The non-transitory computer readable medium 1306 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLURAY® disks, or other types of optical storage, or other types of storage devices. Note that the instructions discussed above can be provided on one computer-readable or machine-readable storage medium, or alternatively, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions or located at a remote site from which machine-readable instructions can be downloaded over a network for execution.

It should be appreciated that computer system 1300 (or computing system) is only one example of a computing system, and that computer system 1300 may have more or fewer components than shown, may combine additional components not depicted in the example embodiment of FIG. 13, and/or computer system 1300 may have a different configuration or arrangement of the components depicted in FIG. 13. The various components shown in FIG. 13 may be implemented in hardware, software, or a combination of both hardware and software, including one or more signal processing and/or application specific integrated circuits.

Further, the steps in the processing methods described herein may be implemented by running one or more functional modules in an information processing apparatus such as general purpose processors or application specific chips, such as application-specific integrated circuits (ASICs), field programmable gate arrays (FPGAs), or programmable logic devices (PLDs), or other appropriate devices. These modules, combinations of these modules, and/or their combination with general hardware are all included within the scope of protection of the invention.

Models and/or other interpretation aids may be refined in an iterative fashion; this concept is applicable to embodiments of the present methods discussed herein. This can include use of feedback loops executed on an algorithmic basis, such as at a computing device (e.g., computing system 1300, FIG. 13), and/or through manual control by a user who may make determinations regarding whether a given step, action, template, model, or set of curves has become sufficiently accurate for the evaluation of the signal(s) under consideration.

Examples of the disclosure can include one or more of the following clauses.

Clause 1. A system for measuring mutual inductance between adjacent first communication transmission line and second communication transmission line, the system comprising:
    a mutual inductance measurement circuit comprising:
        a coupling generator (208) which biases the first communication transmission line (306) with a current ramp signal (500);
        a sample and hold circuit (212) which captures an induced voltage on the second communication transmission line (308) using a switched capacitor storage element;
        a switched capacitor integrator configured to integrate the induced voltage onto an output voltage node; and
        a comparator (214) configured to switch states once the switched capacitor integration has surpassed a reference trippoint.

Clause 2. The system of clause 1, further comprising a coupling generator which utilizes a DC current source and a capacitor to generate a linear voltage ramp and an op-amp feedback circuit which performs voltage-to-current conversion to generate the current ramp signal.

Clause 3. The system of clause 1 or clause 2, wherein the current ramp signal on the first communication transmission line induces a voltage on the second communication transmission line.

Clause 4. The system of any of clauses 1-3, wherein the first communication transmission line is an aggressor line.

Clause 5. The system of any of clauses 1-4, wherein the second communication transmission line is a victim line.

Clause 6. The system of any of clauses 1-5, wherein the first communication transmission line and the second communication transmission line are high-speed analog communications channels.

Clause 7. The system of any of clauses 1-6, wherein the first communication transmission line and the second communication transmission line are digital communications channels.

Clause 8. The system of any of clauses 1-7, wherein the digital communications channels comprise application-specific integrated circuits (ASICs) or field programmable gate arrays (FPGAs).

Clause 9. The system of any of clauses 1-8, further comprising a processor configured to receive an output from the voltage comparator and determine the magnitude of mutual inductance.

Clause 10. The system of any of clauses 1-9, wherein the voltage comparator is a dynamic, clocked voltage comparator.

Clause 11. A method to determine a mutual inductance between a first communication transmission line and a second communication transmission line, the method comprising:

providing a periodic coupling current ramp signal to a first communication transmission line (306) that induces a voltage on a nearby second communication transmission line (308), wherein the voltage is sampled and held on a capacitor (318);

integrating the voltage onto a feedback capacitor (330) of a switched capacitor integrator (324) when the charge is positive due to a positive change in voltage of the periodic coupling ramp signal on the first communication transmission line (306);

integrating the voltage until it crosses a known threshold as measured on a comparator (332); and counting a number of cycles required to cross the known threshold to infer a mutual inductance between the first communication transmission line (306) and the second communication transmission line (308).

Clause 12. The method of clause 11, wherein prior to the providing the periodic coupling ramp signal, the method comprises resetting the switched capacitor integrator (324) by closing and reopening a switch (328) in parallel with the switched capacitive integrator (324).

Clause 13. The method of clause 11 or clause 12, wherein the first communication transmission line is an aggressor line.

Clause 14. The method of any of clauses 11-13, wherein the second communication transmission line is a victim line.

Clause 15. The method of any of clauses 11-14, wherein the first communication transmission line and the second communication transmission line are high-speed analog communications channels.

Clause 16. The method of any of clauses 11-15, wherein the first communication transmission line and the second communication transmission line are digital communications channels.

Clause 17. The method of any of clauses 11-16, wherein the digital communications channels comprise application-specific integrated circuits (ASICs) or field programmable gate arrays (FPGAs).

Clause 18. The method of any of clauses 11-17, further comprising receiving, at a processor, an output from the voltage comparator circuit and determining a capacitive-based coupling.

Clause 19. A method to determine a mutual inductance between a first communication transmission line and a second communication transmission line, the method comprising:

providing a periodic coupling current ramp signal to a first communication transmission line (306) that induces a voltage on a nearby second communication transmission line (308), wherein the voltage is sampled and held on a first capacitive storage element (806);

providing a periodic current pulse signal to a first communication transmission line (306) that capacitively couples a charge onto a nearby second communication transmission line (308), wherein a non-ideality of the charge that is capacitively coupled is sampled and held on a second capacitive storage element (808);

removing the charge that is capacitively coupled from a measurement through a differential switched capacitor integrator (816);

integrating the voltage onto a feedback capacitor (822) of a differential switched capacitor integrator (816) when the charge is positive due to a positive change in voltage of the periodic coupling ramp signal on the first communication transmission line (306);

integrating the voltage until it crosses a known threshold as measured on a comparator (824); and counting a number of cycles required to cross the known threshold to infer a mutual inductance between the first communication transmission line (306) and the second communication transmission line (308).

Clause 20. The method of clause 19, wherein prior to the providing the periodic coupling ramp signal, the method comprises resetting the differential switched capacitor integrator (816) by closing and reopening a switch (820) in parallel with the capacitor integrator (822).

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. Moreover, the order in which the elements of the methods are illustrated and described may be re-arranged, and/or two or more elements may occur simultaneously. The embodiments were chosen and described in order to best explain the principles of the invention and its practical applications, to thereby enable others skilled in the art to best utilize the invention and various embodiments with various modifications as are suited to the particular use contemplated.

Notwithstanding that the numerical ranges and parameters setting forth the broad scope of the embodiments are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

The following embodiments are described for illustrative purposes only with reference to the Figures. Those of skill in the art will appreciate that the following description is exemplary in nature, and that various modifications to the parameters set forth herein could be made without departing from the scope of the present embodiments. It is intended that the specification and examples be considered as examples only. The various embodiments are not necessarily mutually exclusive, as some embodiments can be combined with one or more other embodiments to form new embodiments.

While the embodiments have been illustrated respect to one or more implementations, alterations and/or modifications can be made to the illustrated examples without departing from the spirit and scope of the appended claims. In addition, while a particular feature of the embodiments may have been disclosed with respect to only one of several implementations, such feature may be combined with one or more other features of the other implementations as may be desired and advantageous for any given or particular function.

Furthermore, to the extent that the terms "including", "includes", "having", "has", "with", or variants thereof are used in either the detailed description and the claims, such terms are intended to be inclusive in a manner similar to the term "comprising." As used herein, the phrase "one or more of", for example, A, B, and C means any of the following: either A, B, or C alone; or combinations of two, such as A and B, B and C, and A and C; or combinations of A, B and C.

Other embodiments will be apparent to those skilled in the art from consideration of the specification and practice of the descriptions disclosed herein. It is intended that the specification and examples be considered as exemplary only, with a true scope and spirit of the embodiments being indicated by the following claims.

What is claimed is:

1. A system for measuring mutual inductance between an adjacent first communication transmission line and second communication transmission line, the system comprising:
   a mutual inductance measurement circuit comprising:
   a coupling generator which biases the first communication transmission line with a current ramp signal;
   a sample and hold circuit which captures an induced voltage on the second communication transmission line using a switched capacitor storage element;
   a switched capacitor integrator configured to integrate the induced voltage onto an output voltage node; and
   a comparator configured to switch states once the switched capacitor integration has surpassed a reference trippoint.

2. The system of claim 1, wherein the coupling generator uses a DC current source and a capacitor to generate a linear voltage ramp and an op-amp feedback circuit which performs voltage-to-current conversion to generate the current ramp signal.

3. The system of claim 1, wherein the current ramp signal on the first communication transmission line induces the induced voltage on the second communication transmission line.

4. The system of claim 1, wherein the first communication transmission line is an aggressor line.

5. The system of claim 1, wherein the second communication transmission line is a victim line.

6. The system of claim 1, wherein the first communication transmission line and the second communication transmission line are high-speed analog communications channels.

7. The system of claim 1, wherein the first communication transmission line and the second communication transmission line are digital communications channels.

8. The system of claim 7, wherein the digital communications channels comprise application-specific integrated circuits (ASICs) or field programmable gate arrays (FPGAs).

9. The system of claim 1, further comprising a processor configured to receive an output from the comparator and determine a magnitude of mutual inductance.

10. The system of claim 1, wherein the voltage comparator is a dynamic, clocked voltage comparator.

11. A method to determine a mutual inductance between a first communication transmission line and a second communication transmission line, the method comprising:
   providing a periodic coupling current ramp signal to a first communication transmission line that induces a voltage on a nearby second communication transmission line, wherein the voltage is sampled and held on a capacitor;
   integrating the voltage onto a feedback capacitor of a switched capacitor integrator when the charge is positive due to a positive change in voltage of the periodic coupling ramp signal on the first communication transmission line;
   integrating the voltage until the voltage crosses a known threshold as measured on a comparator; and
   counting a number of cycles required to cross the known threshold to infer a mutual inductance between the first communication transmission line and the second communication transmission line.

12. The method of claim 11, wherein prior to the providing the periodic coupling ramp signal, the method comprises resetting the switched capacitor integrator by closing and reopening a switch in parallel with the switched capacitive integrator.

13. The method of claim 11, wherein the first communication transmission line is an aggressor line.

14. The method of claim 11, wherein the second communication transmission line is a victim line.

15. The method of claim 11, wherein the first communication transmission line and the second communication transmission line are high-speed analog communications channels.

16. The method of claim 11, wherein the first communication transmission line and the second communication transmission line are digital communications channels.

17. The method of claim 16, wherein the digital communications channels comprise application-specific integrated circuits (ASICs) or field programmable gate arrays (FPGAs).

18. The method of claim 11, further comprising receiving, at a processor, an output from the comparator circuit and determining a capacitive-based coupling.

19. A method to determine a mutual inductance between a first communication line and a second communication line, the method comprising:
   providing a periodic coupling current ramp signal to a first communication transmission line that induces a voltage on a nearby second communication transmission line, wherein the voltage is sampled and held on a first capacitive storage element;
   providing a periodic current pulse signal to the first communication transmission line that capacitively couples a charge onto the nearby second communication transmission line, wherein a non-ideality of the charge that is capacitively coupled is sampled and held on a second capacitive storage element;

removing the charge that is capacitively coupled from a measurement through a differential switched capacitor integrator;

integrating the voltage onto a feedback capacitor of the differential switched capacitor integrator when the charge is positive due to a positive change in voltage of the periodic coupling ramp signal on the first communication transmission line;

integrating the voltage until the voltage crosses a known threshold as measured on a comparator; and counting a number of cycles required to cross the known threshold to infer a mutual inductance between the first communication transmission line and the second communication transmission line.

20. The method of claim 19, wherein prior to the providing the periodic coupling ramp signal, the method comprises resetting the differential switched capacitor integrator by closing and reopening a switch in parallel with the differential switched capacitor integrator.

* * * * *